US007017089B1

(12) United States Patent
Huse

(10) Patent No.: US 7,017,089 B1
(45) Date of Patent: Mar. 21, 2006

(54) METHOD AND APPARATUS FOR TESTING A CONTENT ADDRESSABLE MEMORY DEVICE

(75) Inventor: Charles C. Huse, Los Altos, CA (US)

(73) Assignee: NetLogic Microsystems, Inc, Mountain View, CA (US)

( * ) Notice: Subject to any disclaimer, the term of this patent is extended or adjusted under 35 U.S.C. 154(b) by 325 days.

(21) Appl. No.: 10/004,209

(22) Filed: Nov. 1, 2001

(51) Int. Cl.
 *G11C 29/00* (2006.01)

(52) U.S. Cl. .................. 714/718; 711/108; 713/30; 365/49

(58) Field of Classification Search ............... 702/117; 365/49, 201; 714/718, 713; 711/108
See application file for complete search history.

(56) References Cited

U.S. PATENT DOCUMENTS

| 4,888,731 | A | * | 12/1989 | Chuang et al. ............... 365/49 |
| 5,438,535 | A | * | 8/1995 | Lattibeaudiere ............. 365/49 |
| 6,341,092 | B1 | * | 1/2002 | Agrawal ..................... 365/201 |
| 6,373,737 | B1 | * | 4/2002 | Lysinger ..................... 365/49 |
| 6,374,325 | B1 | * | 4/2002 | Simpson et al. ............ 711/108 |
| 6,539,324 | B1 | * | 3/2003 | Miyatake et al. ........... 702/117 |
| 6,597,595 | B1 | * | 7/2003 | Ichiriu et al. ................ 365/49 |
| 6,732,227 | B1 | * | 5/2004 | Baumann .................... 711/108 |

* cited by examiner

*Primary Examiner*—Guy Lamarre
*Assistant Examiner*—John P. Trimmings
(74) *Attorney, Agent, or Firm*—Shemwell Mahamedi LLP

(57) ABSTRACT

According to one embodiment of the present invention, the CAM device includes a CAM array that includes a plurality of rows of CAM cells each coupled to a match line, a priority encoder coupled to the match lines to generate an index, a counter and compare logic coupled to the counter and the priority encoder to compare the index and a counter value from the counter.

42 Claims, 12 Drawing Sheets

FIG. 3

301 RESET ACTR

302 LOOP (TABLE DEPTH)
303    WRITE LOCAL MASK = 0000
304    WRITE MEMORY = 0000
305    INCREMENT ACTR

306 WRITE COMPARAND = FFFF

307 RESET ACTR

308 LOOP (TABLE DEPTH)
309    WRITE LOCAL MASK = FFFF
310    COMPARE
311    WRITE LOCAL MASK = 0000
312    INCREMENT ACTR

FIG. 6

601 RESET ACTR

602 LOOP (TABLE DEPTH)
603 WRITE MEMORY = (DATA)
604 INCREMENT ACTR

605 WRITE COMPARAND = (DATA)

606 RESET ACTR

607 LOOP (TABLE DEPTH)
608 COMPARE
609 SET EMPTY @ HPM
610 INCREMENT ACTR

RESET ACTR — 901

FILL MEMORY:
WRITE ACTR TO MEMORY @ ACTR — 902
INCREMENT ACTR — 903
— 904

LOOP (TABLE DEPTH) — 905
COPY ACTR TO COMPARAND — 906
COMPARE — 907
INCREMENT ACTR — 908

FIG. 9

METHOD AND APPARATUS FOR TESTING A CONTENT ADDRESSABLE MEMORY DEVICE

FIELD OF THE INVENTION

The present invention relates generally to content addressable memory (CAM) devices. More specifically, the present invention relates to a method and apparatus for managing a CAM device for efficient testing of the CAM device.

BACKGROUND OF THE INVENTION

Memory devices such as monolithic static random access memory (SRAM) devices and dynamic random access memory (DRAM) devices are typically tested prior to shipment by automated test equipment (ATE) referred to as "memory testers." Memory testers typically include algorithmic pattern generators (APGs) that execute a test pattern or sequence on the memory device as the device under test (DUT). The APG operates under software control from a host system either separate from or integral with the memory tester. APGs typically generate and cycle through row and column addresses of memory locations in the memory device, and write or read data to the selected memory cell(s), in a systematic manner that is controlled by the host software without replicating the entire memory test pattern in separate memory in the memory tester.

While content addressable memory (CAM) devices may be tested on memory devices, they are typically tested on "logic testers" because logic testers typically are better configured to test the additional circuit components (e.g., instruction decoders, encoders, compare operations, mask cells or global masks) and more complicated interfaces (e.g., instruction buses, cascade interfaces) of the CAM devices. Logic testers typically do not include an APG; rather, they are instructed to generate and receive signals on a cycle-per-cycle basis according to test sequence information that is stored in a vector memory. The vector memory is loaded under software control by the host system that is either separate from or integral with the logic tester. Because each location in the vector memory typically stores one clock cycle worth of test sequence information, the total number of tests or memory locations that can be tested in the CAM DUT is limited by the total vector memory size of the logic tester. Additionally, as memory densities increase for DUTs, the required vector memory size of the tester also increases resulting in more expensive testers and higher test costs for the CAM supplier.

One approach used by test designers to reduce the number of vectors in a test sequence, and thus reduce the size of the vector memory, is to write software loops of test vectors. Loops could be used effectively to repeat the execution of a set of test vectors in a test sequence so long as the test data provided to the CAM DUT is the same from cycle to cycle, and the data expected to be received from the CAM DUT is the same from cycle to cycle, This approach, however, cannot, without utilizing more vector memory, accommodate test sequences that need to provide different inputs, or expect different outputs, from the CAM DUT from cycle to cycle. That is, vector-based logic testers typically cannot utilize variables inside a test loop without replicating the individual test inputs or outputs in the vector memory from cycle to cycle. Without the utilization of variables to create an indexing mechanism to aid in the generation, comparison and verification of unique data generated in a loop for a CAM DUT, the effectiveness of the looping technique, by itself, is limited.

SUMMARY

A method and apparatus is described for testing a content addressable (CAM) device. According to one embodiment of the present invention, the CAM device includes a CAM array that includes a plurality of rows of CAM cells each coupled to a match line, a priority encoder coupled to the match lines to generate an index, a counter and compare logic coupled to the counter and the priority encoder to compare the index and a counter value from the counter.

BRIEF DESCRIPTION OF THE DRAWINGS

The features and advantages of the present invention are illustrated by way of example and are by no means intended to limit the scope of the present invention to the particular embodiments shown, and in which:

FIG. 3 illustrates exemplary pseudo code of the method of FIG. 2;

FIG. 6 illustrates exemplary pseudo code of the method of FIG. 5;

FIG. 9 illustrates exemplary pseudo code of the method of FIG. 8;

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

The present invention described herein concerns various embodiments of CAM devices that include additional circuit components such as compare circuits that improve the ability of the CAM device to be tested by ATEs such as logic testers or memory testers. The CAM devices described herein also may utilize the additional circuit components to provide built-in self-test (BIST) capabilities for the CAM devices. The improved CAM device architectures enable, for example, test sequences, that include variables that change during the test sequence, to incorporate test loops which utilize reduced memory resources of the tester that is interfacing with the CAM device under test.

Embodiments of the present invention (e.g., exemplary processes described below with respect to FIGS. 2, 3, 5, 6, 8, and 9) may be provided as a computer program product, or software, that may include a machine-readable medium having stored thereon instructions. The machine readable medium may be used to program a computer system or other electronic devices. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

Figure 1:
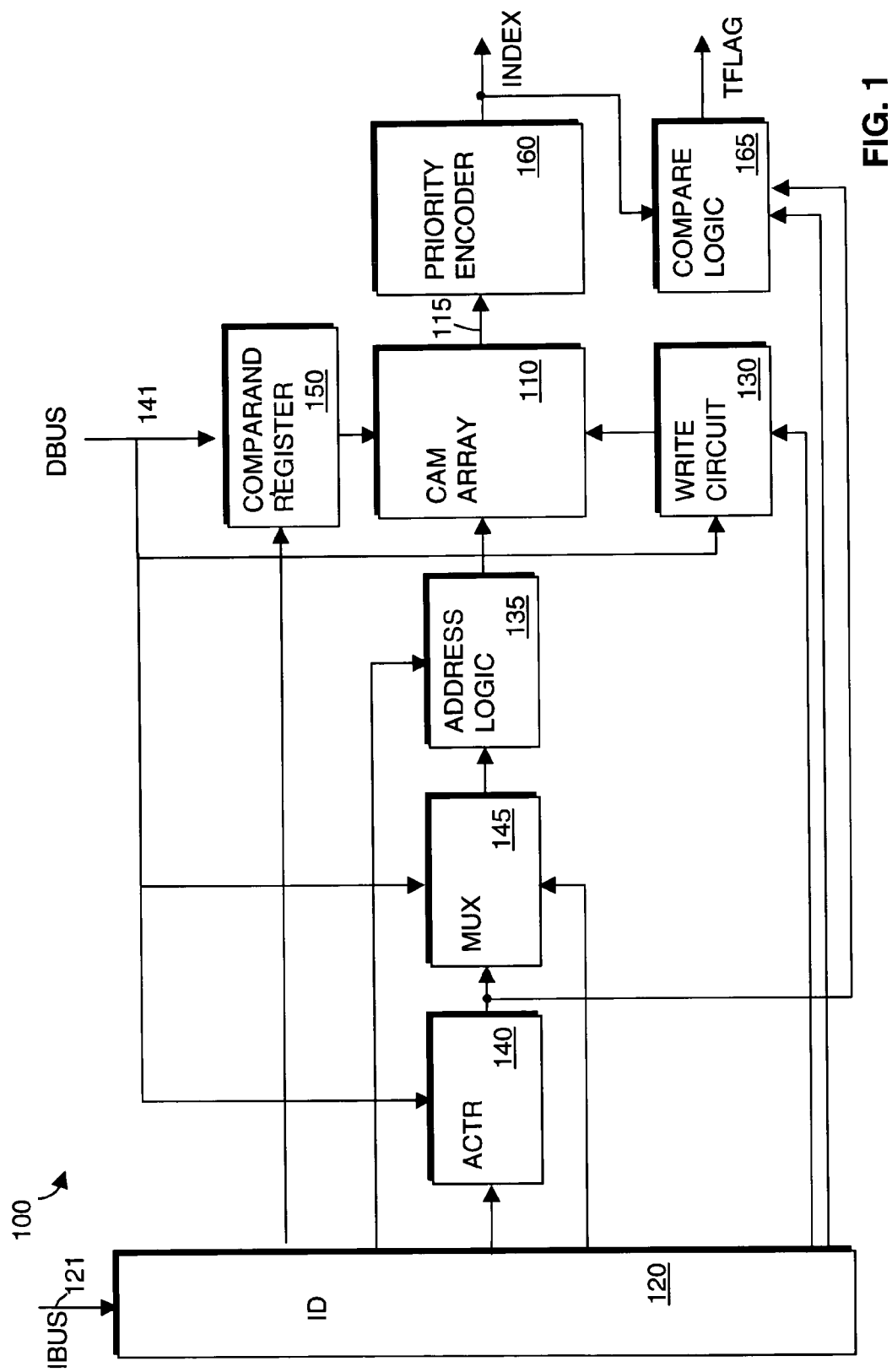
FIG. 1 is a block diagram of a CAM device according to an embodiment of the present invention.

FIG. 1 is a block diagram of a CAM device 100 according to an embodiment of the present invention. CAM device 100 includes instruction decoder 120, comparand register 150, address counter (ACTR) 140, address logic 135, CAM array 110, priority encoder 160, write circuit 130 and compare logic 165. CAM device 100 may include other circuit components such as read circuitry, flag logic (e.g., match flag, multiple match flag, full flag, etc.), one or more global mask registers, priority logic, error detection logic, timing generators, and the like which are not shown. The CAM array 110 includes a plurality of rows of CAM cells (not shown) for storing data, and may be segmented into any number of blocks or sub-arrays of CAM cells which may be configurable or combined to support different width and depth configurations. The CAM cells may be any type of CAM cells including binary or ternary CAM cells or other types of CAM cells formed from volatile or non-volatile technologies. For one embodiment, each CAM cell is a ternary CAM cell that has a corresponding mask cell (not shown) in the CAM array 110 that may be used to mask the contents of the CAM cell during a compare operation. Each row of CAM cells, or groups of CAM cells within a row, may also include one or more validity bits that indicate whether data stored in the data words of the CAM cells is valid or invalid (i.e., empty) data.

The instruction decoder 120 receives and decodes instructions on IBUS 121 for the CAM device. The instructions may be received from components such as processing units (e.g., a network processing unit or "NPU", a microprocessing units or "MPU" or "CPU", other controlling devices), or an ATE such as a memory tester or logic tester. The instruction decoder 120 decodes the received instructions and generates control signals for components in the CAM device 100 to control the execution of the instruction within the device (e.g., write to or read from the CAM array, compare, etc.). Note that one or more clock signals may synchronize the supply and execution of the instruction within the CAM device.

In response to a write instruction, address logic 135 can access one or more CAM cells in one or more rows of CAM cells CAM array 110, and data provided on data bus DBUS 141 may be written to the selected cell(s) by write circuit 130. For one embodiment, address logic 135 may include row decoding and/or column decoding circuitry to select one or more word lines and/or bit lines of CAM cells in the CAM array. Write circuit 130 may include write drivers that are coupled (i.e., connected directly or indirectly through one or more intervening circuits) to one or more bit lines (not shown) in the CAM array 110 so as to provide data over the bit line(s) to the selected cell(s).

The address counter 140 generates counter values. According to an embodiment of the CAM device 100, the address counter 140 generates counter values in response to control signals from the instruction decoder 120. Counter values from the address counter 140 may be used by the address logic 135 to select rows of CAM cells to write data to. Alternatively, the address logic 135 may use values from the DBUS 141 to select rows of CAM cells to write data to. A multiplexer (MUX) 145 is coupled to the address counter 140 and the DBUS 141. The multiplexer 145 selects either a counter value from the address counter 140 or a value from the DBUS 141 to forward to the address logic 135 in response to a control signal from the instruction decoder 120. According to an embodiment of the CAM device 100, additional address sources may be used for address logic 135, and selectively provided to address logic 135 by multiplexer 145. For example, the next free address location in CAM array 110 or the highest priority match address location in CAM array 110 may be coupled to the multiplexer 145 (e.g., from register elements in CAM device 100) where the next free address or the highest priority match address may be selected to be forwarded to the address logic 135 in response to a control signal from the instruction decoder 120.

The comparand register 150 stores values that may be compared with data stored in the CAM array 110 in response to control signals from the instruction decoder 120. The comparand values stored in the comparand register 150 are also referred to as search keys. The comparand register 150 is coupled to the DBUS 141 and receives a search key from the DBUS 141. For alternative embodiments, the comparand register may be omitted. In response to a compare instruction, comparand register 150 provides the search key to CAM array 110 (e.g., over one or more comparand signal lines or, alternatively, over one or more of the data bit lines). CAM array 110 compares the search key against its entries and provides the match results on match lines 115 to priority encoder 160. Additionally, the match results may be provided to flag logic (not shown) that indicates whether there is a match, multiple match, full condition or the like. In response to the signals on the match lines, the priority encoder 160 generates an index or address of the row in the CAM array that stores information (masked or unmasked) that matches the search key and has the highest priority. Priority may be determined between entries in CAM array 110 by the physical location of the entries in the CAM array (i.e., by row number), or by explicit priorities assigned to each entry.

The compare logic 165 is coupled to the priority encoder 160 and the address counter 140. The compare logic 165 performs a comparison between an index output from the priority encoder 160 and a counter value output from the address counter 140, and generates the signal TFLAG whose logic state indicates the comparison result. Compare logic 165 may be particularly useful in performing BIST test sequences generated within the CAM Device 100 (e.g., by a control unit) or test sequences provided by external stimuli such as an ATE or other circuitry. Because ACTR 140 can be readily updated (e.g., either incremented or decremented) in response to one or more instructions decoded by instruction decoder 120, compare logic 165 can be used to flag test results for a number of tests that can be executed on CAM device 100 in an efficient manner. Some examples of the tests that can be executed on CAM device 100 utilizing compare logic 165 are illustrated below. However, many other tests may also be run on CAM device 100 utilizing compare logic 165, and scope of this application is not limited to only those examples described below.

It should be appreciated that the CAM array 110, instruction decoder 120, write circuit 130, address logic 135, address counter 140, multiplexer 145, comparand register 150, priority encoder 160, and compare logic 165 may be implemented using any known technique or circuitry. According to an embodiment of the present invention, the CAM array 110, instruction decoder 120, write circuit 130, address logic 135, address counter 140, multiplexer 145, comparand register 150, priority encoder 160, and compare logic 165 all reside on a single semiconductor substrate, for other embodiments one or more of the circuits may reside on a separate substrate.

Additionally, while particular input and output buses are shown for CAM device 100, the signals on these buses may be time multiplexed over one or more of the other buses.

CAM device 100 is also shown as an asynchronous device. In alternative embodiments, one or more clock signals may be provided to CAM device 100 and one or more of its circuit components to synchronize operations in the device.

Figure 2:
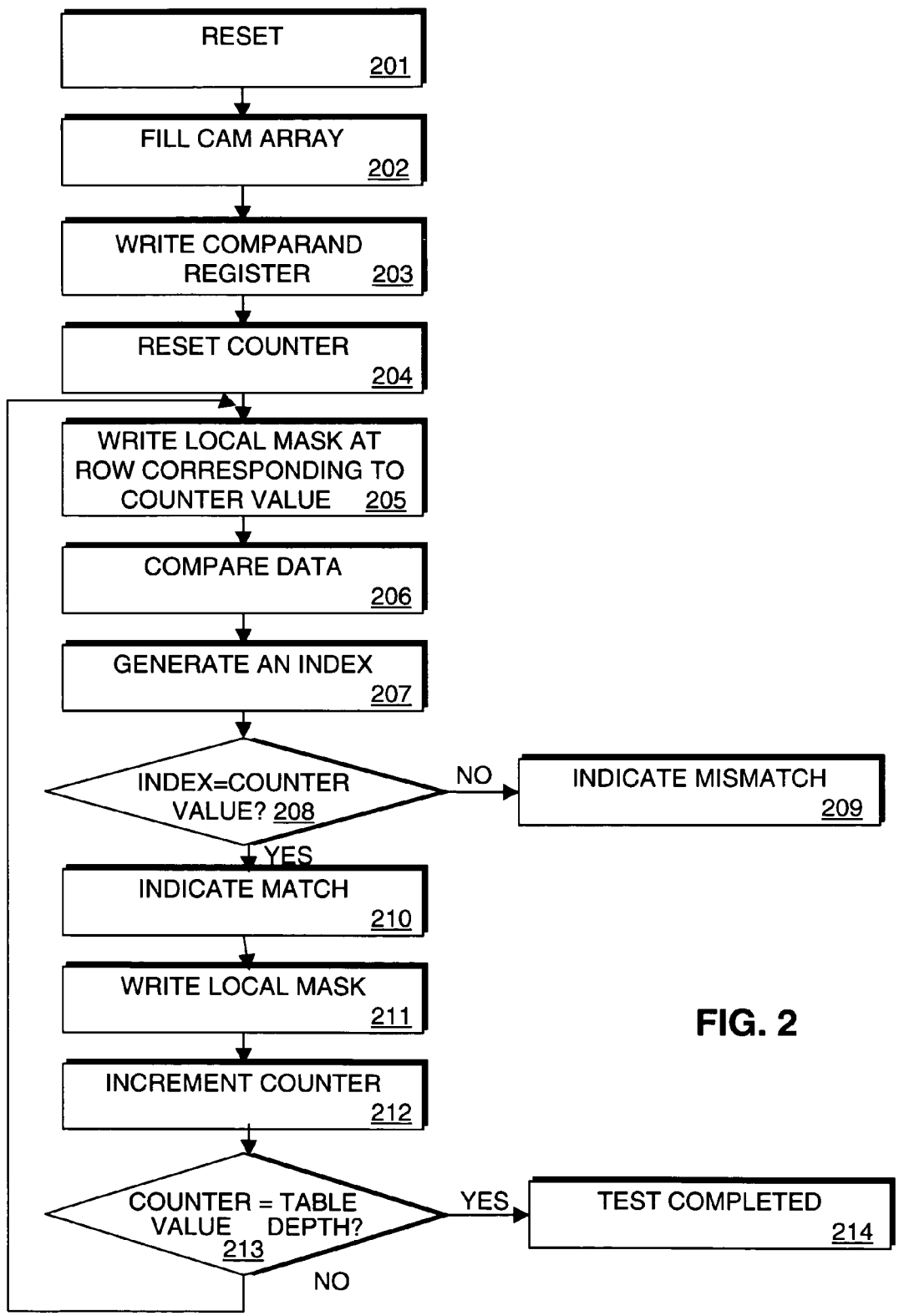
FIG. 2 is a flow chart illustrating a method of operating the CAM device of FIG. 1.

FIG. 2 is a flow chart illustrating one example of performing a test sequence to test various circuit components of CAM device 100. In this example, CAM array 110 is a ternary CAM array with each row of CAM cells having a corresponding local mask row. Address counter 140 and compare logic 165 are used to help test, among other circuits, the local mask cells, the compare circuitry in the CAM array, and the priority encoder of the CAM device. In this example, all rows of CAM cells in the CAM array are written with data that mismatches (i.e., is different than) a search key. Each row is then selectively masked using its local masks such that only the row with its CAM cells masked will generate a match. The index generated by the priority encoder is then compared with the counter value and the result reflected on TFLAG. TFLAG can be monitored by the testing device (e.g., an ATE or other control circuit) to determine if the generated index matches the masked row index.

At step 201, CAM device 100 is reset. At step 202, CAM array 110 is filled such that each row of CAM cells in the CAM array is loaded with data (e.g., all logic zeros) that is different (by least one bit) from a search key, and each corresponding local mask is written with data such that all of the rows are unmasked. According to an embodiment of the present invention, this may be achieved by writing logic zeros into the local mask cells in memory. A fill of CAM array may be accomplished through a number of instruction sequences provided to instruction decoder 120. For example, each local mask and data word in CAM array 110 may be separately addressed and written to until the array is full. The external testing device or system may provide the addresses, or may use ACTR 140 to increment through the local masks and data words in the CAM array in any order in response to instructions decoded by instruction decoder 120. At step 203, a search key is written into the comparand register of the CAM device. The search key is different (by at least one bit) than all of the entries stored in the data words of the CAM array. According to an embodiment of the present invention, the data includes values having all logic ones while each of the data words stores all logic zeros.

At step 204, an instruction or control signal is provided to instruction decoder 120 to cause ACTR 140 to be reset to zero. In other embodiments, the counter may be reset to other predetermined values. At step 205, instruction decoder 120 decodes a write instruction that causes the local mask word of CAM cells in row zero of CAM array 110 to be masked. According to an embodiment of the present invention, this is achieved by writing logic ones into the local mask cells of the row. Step 205 may be performed by having the address logic 135 select row zero in response to the output of ACTR 140 and write circuit 130 writing the appropriate data to the local mask cells.

At step 206, the search key is compared with the data stored in each row of CAM cells in the CAM array and the compare results reflected on match lines 115. This may occur in response to the write instruction of step 205 or in response to an explicit, separate compare instruction. In response to the match results on match lines 115, priority encoder 160 generates an index at step 207. When CAM device 100 is functioning properly, the index generated by the priority encoder will be zero corresponding to row zero of CAM array 110 that is totally masked.

At step 208, compare logic 165 compares the index generated by the priority encoder 160 with the counter value generated by the address counter 140. If the index generated is not the same as the counter value, TFLAG is deasserted to an inactive state to indicate a mismatch at step 209. If the index generated is the same as the counter value, TFLAG is asserted to an active state to indicate a match at step 210. The testing device can monitor TFLAG to determine whether the CAM device is performing correctly or whether there is a malfunction in the CAM device. When TFLAG indicates a malfunction (i.e., a mismatch), the testing device can log the error and continue, or may halt the test.

At step 211, the instruction decoder decodes an instruction that causes the local mask for row zero in CAM array 110 to be written to so as to unmask all of the bits in the corresponding data word of row zero. According to an embodiment of the present invention, this may be achieved by writing zeros into the local mask cells of the row.

At step 212, address counter 140 is incremented by one. A separate increment instruction may be provided to instruction decoder 120 to increment counter 140, or the counter may be incremented in response to the write local mask instruction from step 211.

At step 213, it is determined (e.g., by the testing device) whether the counter value is equal to the table depth. The table depth is the total number of memory locations in the CAM array 110 that are desired to be tested. If the counter value is equal to the table depth, the test sequence is complete as indicated at step 214. If the counter value is not equal to the table depth, control proceeds to step 205.

FIG. 3 illustrates pseudo code describing the operation of the test sequence of FIG. 2 and for generating the instructions for CAM device 100. The exemplary pseudo code is written with hexadecimal notation for a CAM device having rows of 16 CAM cells. It should be appreciated that other notation may be used and that the CAM devices may have rows having any number of CAM cells. The pseudo code may be implemented in any software language (e.g., C, C++, etc.) and run on any ATE, processor or other test device or system interfacing with CAM device 100. Each line of code, or a combination or lines of code, represents one or more instructions that are provided to the CAM device to implement the test sequence.

Lines 301, 302–305, 306, 307, and 308–312 of the pseudo-code represent steps 201–202, 203, 204, and 205–214, respectively of FIG. 2. As is evident from the pseudo-code of FIG. 3, the addition of compare logic 165 in CAM device 100 allows for the test sequences of FIGS. 2 and 3 to be implemented in a loop. Advantageously, this loop may be readily implemented by test devices or systems that are communicating the test sequence to, and monitoring the test results from, the CAM device under test. For example, the test loops can readily be implemented in vector memory of logic ATE testers without using a different group of vectors (and the associated vector memory locations) for each pass through the loop every time the counter is incremented. That is, without compare logic 165 to compare the output of ACTR 140 and the index generated by priority encoder 160, the loop represented by lines 308–312 of the pseudo-code would be implemented in vector memory as separate vectors for each time the counter is incremented requiring at least 2n the number of vector memory locations, where n is the number of locations in CAM array 110 that are to be tested. The addition of compare logic 165 allows the tester to cycle between the vectors that produce lines 308–312. For one embodiment, only two instructions and the corresponding resulting vectors need to be cycled or repeated: one that combines lines 309 and 310 into a single instruction or vector to write to local mask and compare; and one that combines lines 311 and 312 into a single instruction or vector to write to local mask and increment. The reduced vector memory requirements can advantageously allow for less expensive testers to be used to test the CAM device, which in turn can lead to reduced manufacturing and test costs for the supplier.

As indicated above, address logic 135 may have address sources other than explicit addresses provided externally (e.g., over DBUS 141) or by ACTR 140. For example, the address source may be the index output from priority encoder 160 as shown in CAM device 400 of FIG. 4. This may allow for further testing to be efficiently executed on CAM device 100. CAM device 400 includes the same circuit components as in CAM device 100 (shown in FIG. 1), and further includes a highest priority match (HPM) register 470 as a storage element to store the index generated by priority encoder 160. Register 470 stores the index generated by priority encoder 160, for example, in response to a control signal from the instruction decoder 120. The multiplexer 145 is coupled to register 470 and selectively provides the index stored in register 470, the output of ACTR 140 or another address on DBUS 141 to address logic 135 in response to one or more control signals from the instruction decoder 120. For another embodiment, register 470 may be omitted in the path from the output of the priority encoder 160 and multiplexer 145.

Figure 5:
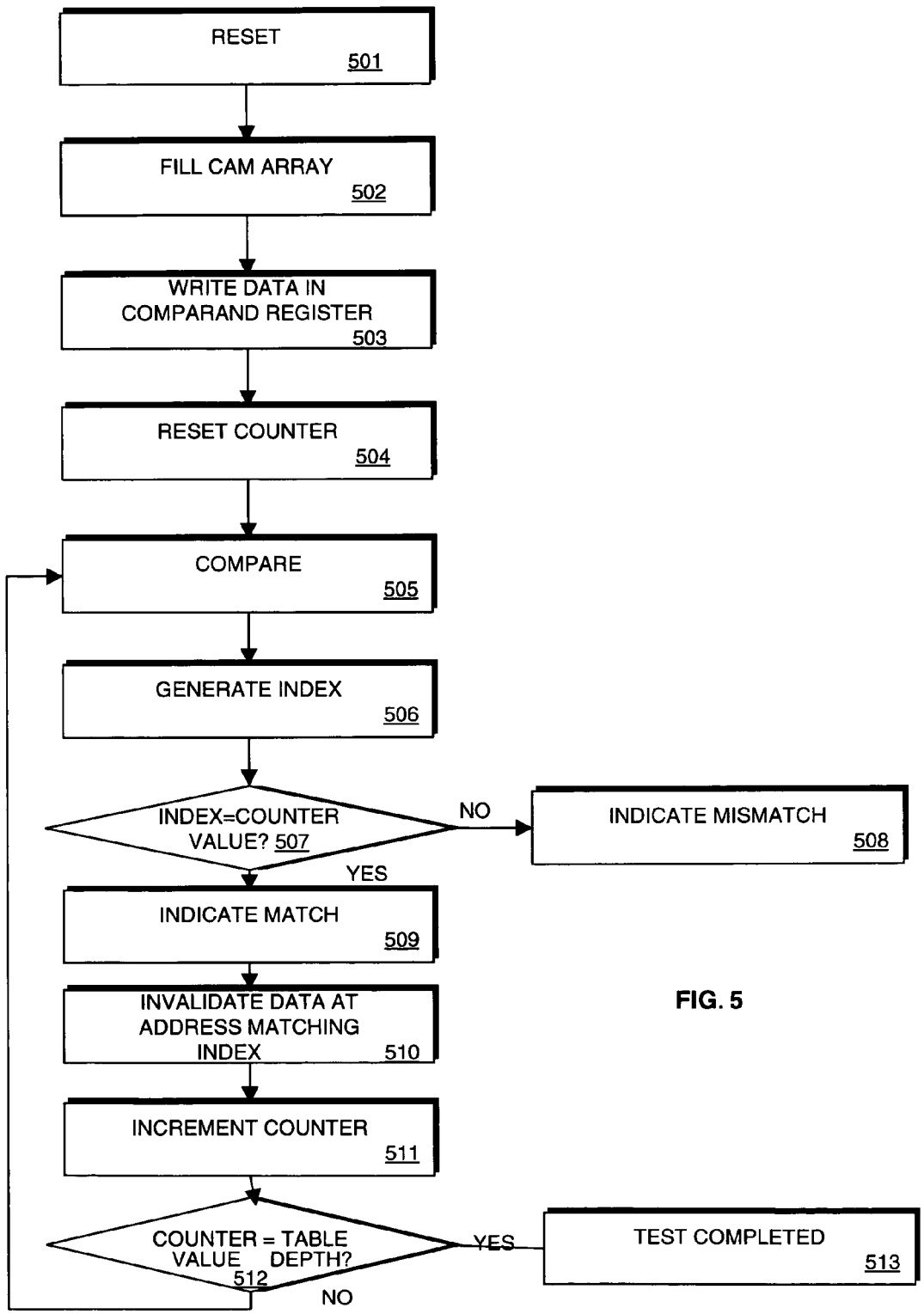
FIG. 5 is a flow chart illustrating a method of operating the CAM device of FIG. 4.

CAM device 400 may be tested with the test sequence of FIGS. 2 and 3. Additionally, various test sequences that use the feedback of the index from priority encoder to address logic 135 may be used. For example, FIG. 5 is a flow chart illustrating another example of performing a test sequence to test various circuit components of CAM device 400. In this example, CAM array 110 may be a binary or ternary CAM array. In this example, address counter 140, compare logic 165, and the feedback path of the index to address logic 135 are used to help test, among other circuit components, the CAM cells, the priority encoder, and one or more validity bits associated with each row or groups of CAM cells within a row of CAM array 110. In this example, the same valid data is written into every location in the CAM array. The counter is reset and a search key having the same value is then compared against the entries. If the CAM device is functioning properly, all locations will indicate a match and the priority encoder will output the index of the highest priority matching location (e.g., row zero). Compare logic 165 compares the output of the counter and the index, and if they match, TFLAG is asserted to a match state. The matching location in the CAM array is then set to an invalid state or loaded with different data, the counter is incremented and the process repeated until all locations in the CAM array have been tested.

At step 501, CAM device 400 is reset. At step 502, CAM array 110 is filled such that each row of CAM cells in the CAM array is loaded with the same data. If CAM array 110 is a ternary CAM array, the CAM cells in each row of the CAM array are also unmasked.

At step 503, a search key is written into the comparand register of the CAM device. The search key has the same value as the data written into each row of the CAM array.

At step 504, an instruction or control signal is provided to instruction decoder 120 to cause ACTR 140 to be reset to zero. In other embodiments, the counter may be reset to other values.

At step 505, a compare instruction is provided to instruction decoder 120 and the search key is compared against the data stored in each row of the CAM array and the compare results reflected on match lines 115. At this point, all of the match lines should indicate a match. At step 506, priority encoder 160 generates an index. If the CAM device is functioning properly, the index generated by the priority encoder should match the address of the highest priority entry in CAM array 110. For example, when the priority of the entries in the CAM array are determined in order, from lowest to highest row number, based on their physical location, the index generated by priority encoder 160 this time should be zero corresponding to address zero in the CAM array.

At step 507, compare logic 165 compares the index generated by the priority encoder with the counter value generated by ACTR 140. If the index generated is not the same as the counter value, TFLAG is deasserted to an inactive state to indicate a mismatch condition at step 508. If the index generated is the same as the counter value, TFLAG is asserted to an active state to indicate a match at step 509. The testing device can monitor TFLAG to determine whether the CAM device is performing correctly or whether there is a malfunction in the CAM device. When TFLAG indicates a malfunction (i.e., a mismatch), the test device can log the error and continue, or may halt the test.

At step 510, the instruction decoder decodes an instruction that causes the data stored at the highest priority row of CAM cells (e.g., row zero) to be invalidated. According to an embodiment of the present invention, this may be achieved by setting the one or more validity bits in the row to an invalid state. Step 510 may be performed by having the address logic 135 select the row having an address that corresponds to the value stored in register 470 (shown in FIG. 4) and then updating the one or more validity bits of that row. Alternatively, the data stored at the selected row may be written to a value different than the search key stored in the comparand register.

At step 511, address counter 140 is incremented by one. A separate increment instruction may be provided to instruction decoder 120 to increment counter 140, or the counter may be incremented in response to the instruction(s) from step 510.

At step 512, it is determined (e.g., by the testing device) whether the counter value is equal to the table depth. The table depth is the total number of memory locations in the CAM array 110 that are desired to be tested. If the counter value is equal to the table depth, the test sequence is complete as indicated at step 513. If the counter value is not equal to the table depth, control proceeds to step 505.

FIG. 6 illustrates pseudo code describing the operation of the test sequence of FIG. 5 and for generating the instructions for CAM device 400. The pseudo code may be implemented in any software language (e.g., C, C++, etc.) and run on any ATE, processor or other test device or system interfacing with CAM device 100. Each line of code, or a combination of lines of code, represents one or more instructions that are provided to the CAM device to implement the test sequence.

Lines 601, 602–604, 605, 606, and 607–610 of the pseudo-code represent steps 501, 502, 503, 504, and 505–513, respectively of FIG. 5. As is evident from the pseudo-code of FIG. 6, the addition of compare logic 165 in CAM device 100 allows for the test sequences of FIGS. 5 and 6 to be implemented in a loop. Advantageously, this loop may be readily implemented by test devices or systems that are communicating the test sequence to, and monitoring the test results from, the CAM device under test. For example, the test loops can readily be implemented in vector memory of logic ATE testers without using a different group of vectors (and the associated vector memory locations) for each pass through the loop every time the counter is incremented. That is, without compare logic 165 to compare the output of ACTR 140 and the index generated by priority encoder 160, the loop represented by lines 607–610 of the pseudo-code would be implemented in vector memory as separate vectors for each time the counter is incremented requiring at least 2× the number of vector memory locations, where x is the number of locations in CAM array 110 that are to be tested. The addition of compare logic 165 allows the tester to cycle between the vectors that produce lines 607–610. For one embodiment, only three instructions and the corresponding resulting vectors need to be cycled or repeated: one for each of lines 608, 609 and 610. For another embodiment, two instructions and the corresponding resulting vectors need to be cycled or repeated: one for line 608, and one that replaces lines 609 and 610 with a write and increment function where the write is a write to the one or more validity bits or a write of data different than the search key. The reduced vector memory requirements can advantageously allow for less expensive testers to be used to test the CAM device, which in turn can lead to reduced manufacturing and test costs for the supplier.

Figure 7:
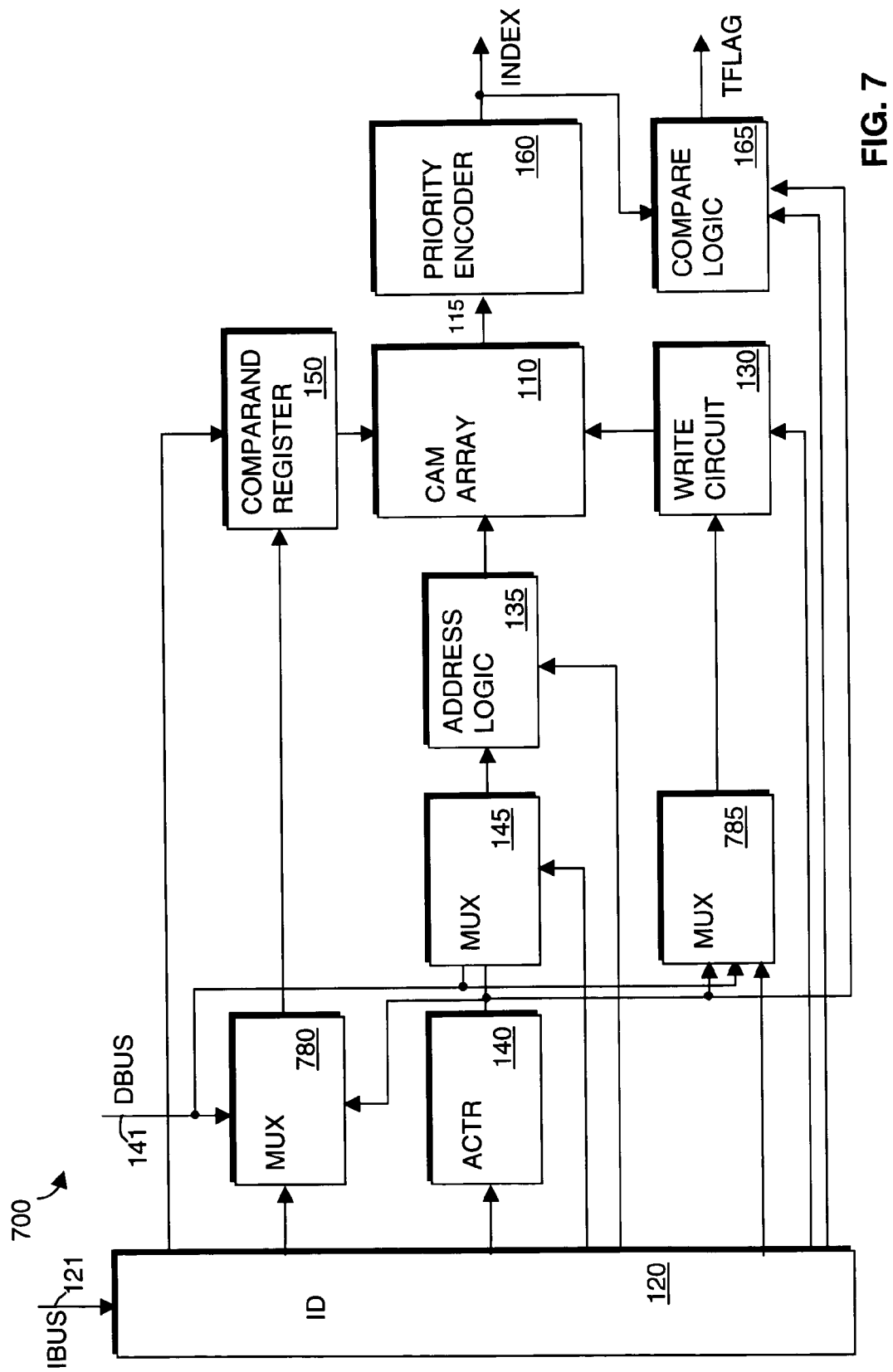
FIG. 7 is a block diagram of a CAM device according to another embodiment of the present invention.

FIG. 7 is a block diagram of a CAM device 700 that includes the same components as in CAM devices 100 or 400, and further includes multiplexers 780 and 785. In response to a control signal from the instruction decoder 120, multiplexer 780 forwards either data from the DBUS 141 or a counter value from the address counter 140 to the comparand register 150. This allows the comparand register 150 to use a counter value from the address counter 140 as a search key. In response to a control signal from the instruction decoder 120, multiplexer 785 forwards either data from the DBUS 141 or a counter value from the address counter 140 to the write circuit 130. This allows the write circuit 130 to write a counter value from the address counter 140 into a row of CAM cells in the CAM array 110.

Figure 8:
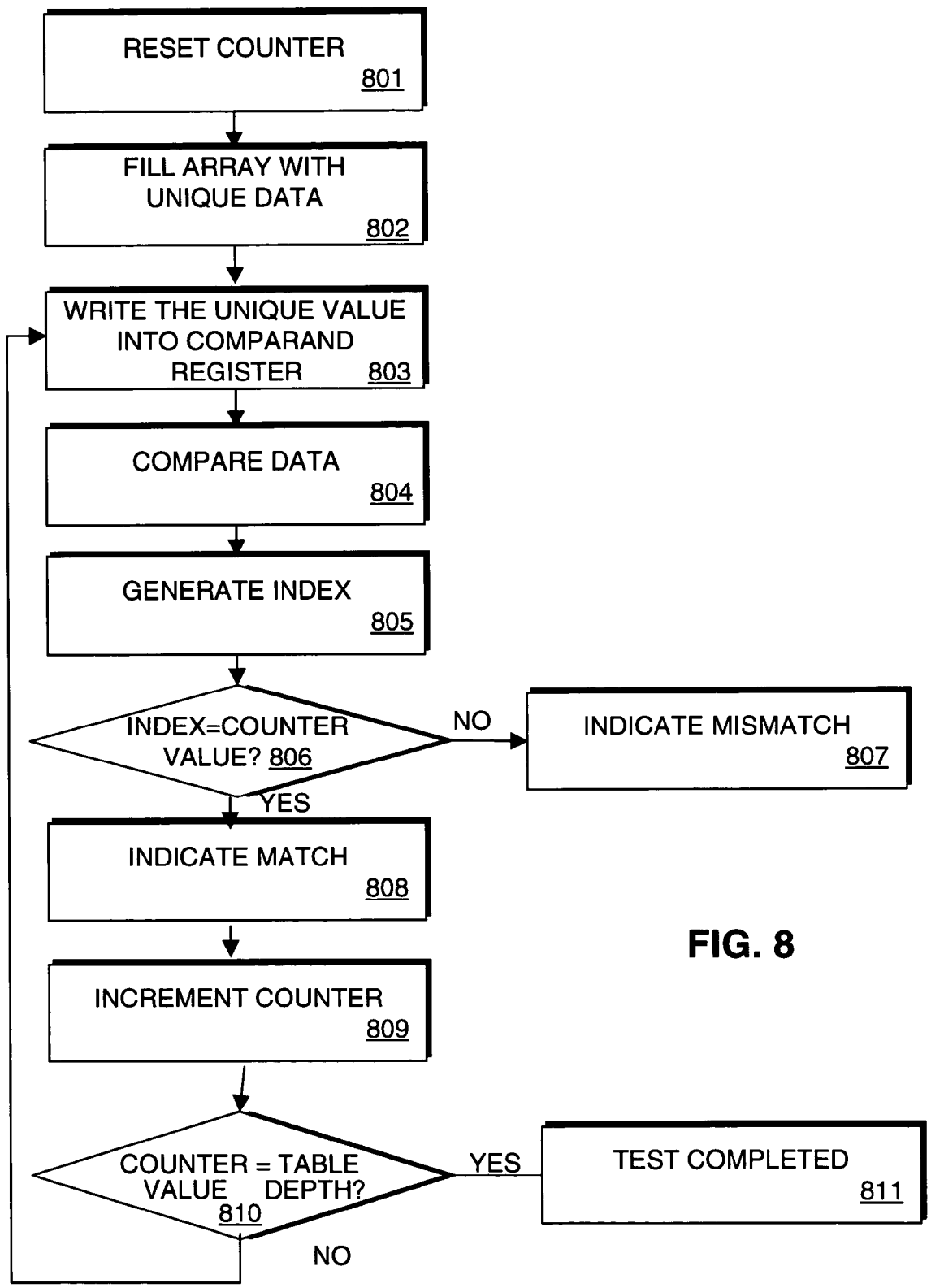
FIG. 8 is a flow chart illustrating a method of operating the CAM device of FIG. 7.

CAM device 700 may be tested with the test sequences of FIGS. 2, 3, 5, and 6. Additionally, various test sequences that use the addition of one or both of multiplexers 780 and 785 may be used. For example, FIG. 8 is a flow chart illustrating another example of performing a test sequence to test various circuit components of CAM device 700. In this example, CAM array 110 may be a binary or ternary CAM array. In this example, ACTR 140, compare logic 165 and multiplexers 780 and 785 are used to help test, among other circuit components, the address logic, the CAM cells, and the priority encoder of the CAM device. In this example, a unique value is written into each row of CAM cells in the CAM array. This may be accomplished by writing the counter value from the address counter into a row addressed by the address counter value, and then systematically incrementing the counter value and repeating the addressing and writing. After the entire array has been written (or after each increment and write operation), the counter value is used again as a search key to compare with the unique values stored in the CAM array. The counter value is updated after each compare to provide a new unique search key for the compares. For each compare, compare logic 165 compares the output of the counter with the index generated by the priority encoder and sets TFLAG accordingly.

At step 801, the counter is reset to a counter value that corresponds to an address of a first row of cells to be tested (e.g., zero). At step 802, CAM array 110 is filled such that each row of CAM cells has a unique value. Step 802 may be performed by having the address logic 135 select a row in the CAM array 110 having an address corresponding to the counter value, having the write circuit 130 write the counter value into the row, incrementing the counter value, and then repeating the write and increment steps until the array is full. This may be accomplished, for example, by the testing device providing two instructions to CAM device 700 (and looping on the two instructions until full): a first one to write the counter value to a row of CAM cells in the CAM array at the address counter value, and a second one to increment the address counter. For other examples, the two instructions may be combined into a single instruction or be spread over more instructions. Note that if the CAM array is a ternary array, then the local mask words are set to unmasked states.

After all of the rows in the CAM array have been written, ACTR 140 may roll-over to its original setting (e.g., a zero), or it may be reset. At step 803, an instruction is provided to instruction decoder 120 that causes the counter value to be written into the comparand register. At step 804, an instruction is provided to instruction decoder 120 that causes the counter value to be compared with data stored in the array and the results reflected on the match lines 115. Steps 803 and 804 may be combined into a single instruction.

At step 805, priority encoder 160 generates an index. At this point only row zero storing a value of zero should match the counter value of zero. At step 806, compare logic 165 compares the index with the counter value. If the index generated is the same as the counter value, TFLAG is asserted an active state to indicate a match at step 808. The testing device can monitor TFLAG to determine whether the CAM device is performing correctly or whether there is a malfunction in the device. When TFLAG indicates a malfunction (i.e., a mismatch between the counter value and the index), at step 807, the test device can log the error and continue, or may halt the test.

At step 809, the instruction decoder decodes an instruction that causes ACTR 140 to increment to the next value (e.g., from zero to one).

At step 810, it is determined (e.g., by the testing device) whether the counter value is equal to the table depth. The table depth is the total number of memory locations in the CAM array 110 that are desired to be tested. If the counter value is equal to the table depth, the test sequence is complete as indicated at step 811. If the counter value is not equal to the table depth, control proceeds to step 803.

FIG. 9 illustrates pseudo code describing the operation of the test sequence of FIG. 8 and for generating the instructions for CAM device 700. The pseudo code may be implemented in any software language (e.g., C, C++, etc.)

and run on any ATE, processor or other test device or system interfacing with CAM device 100. Each line of code, or a combination or lines of code, represents one or more instructions that are provided to the CAM device to implement the test sequence.

Lines 901, 902–904, and 905–908 of the pseudo-code represent steps 801, 802, and 803–811, respectively of FIG. 8. As is evident from the pseudo-code of FIG. 9, the addition of compare logic 165 in CAM device 100 allows for the test sequences of FIGS. 8 and 9 to be implemented in a loop. Advantageously, this loop may be readily implemented by test devices or systems that are communicating the test sequence to, and monitoring the test results from, the CAM device under test. For example, the test loops can readily be implemented in vector memory of logic ATE testers without using a different group of vectors (and the associated vector memory locations) for each pass through the loop every time the counter is incremented. That is, without compare logic 165 to compare the output of ACTR 140 and the index generated by priority encoder 160, the loops represented by lines 902–904 and 905–908 of the pseudo-code would be implemented in vector memory as separate vectors for each time the counter is incremented requiring at least 4× the number of vector memory locations, where x is the number of locations in CAM array 110 that are to be tested. The addition of compare logic 165 allows the tester to cycle between the vectors that produce lines 902–908. The reduced vector memory requirements can advantageously allow for less expensive testers to be used to test the CAM device, which in turn can lead to reduced manufacturing and test costs for the supplier.

Figure 4:
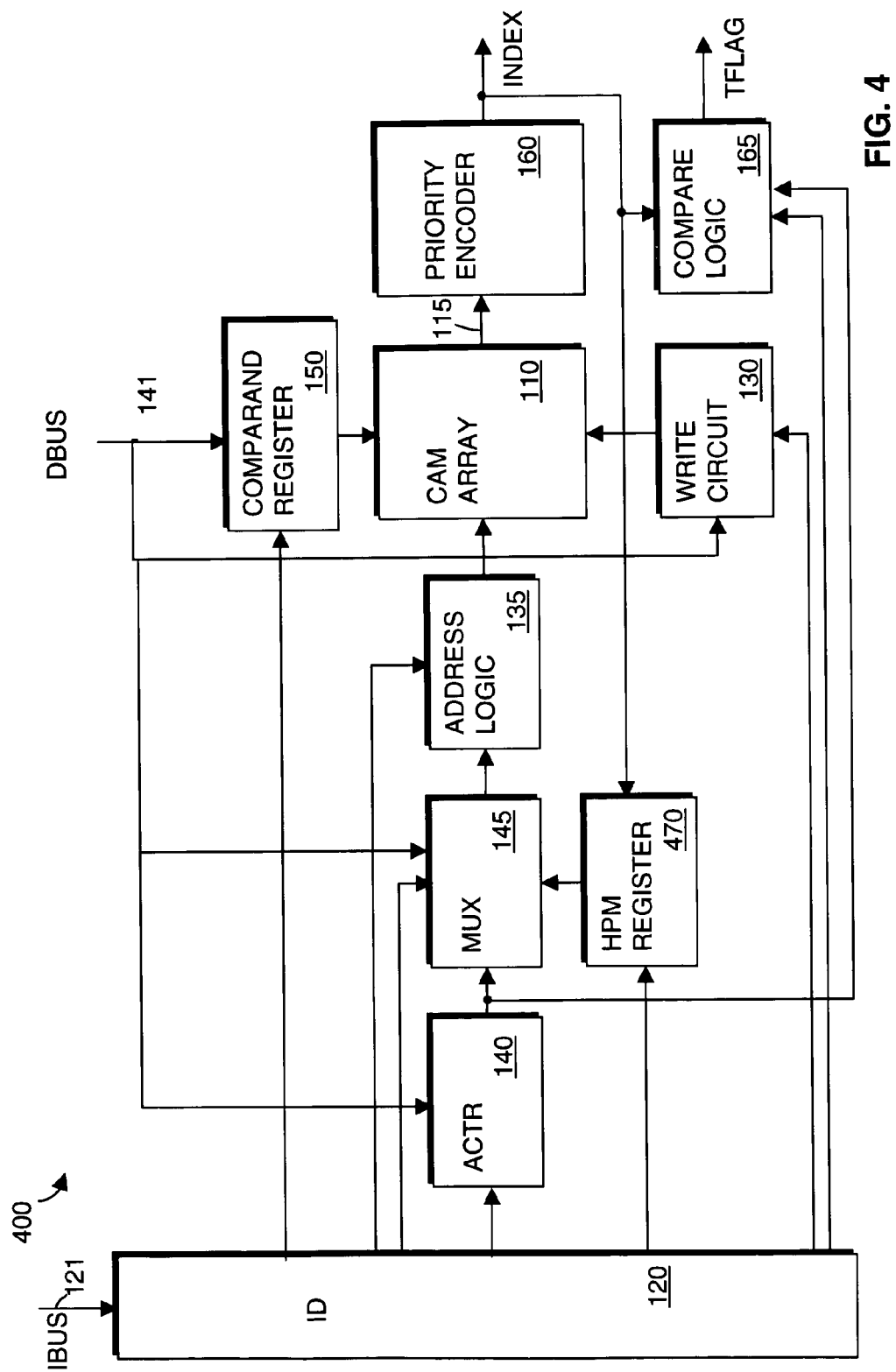
FIG. 4 is a block diagram of a CAM device according to another embodiment of the present invention.

FIGS. 2, 5, and 8 illustrate flow charts describing methods for testing the CAM devices of FIGS. 1, 4, and 7 utilizing the additional compare logic 165 and one or more multiplexers such as multiplexers 145, 780 and 785. Some of the steps illustrated in these figures may be performed sequentially, in parallel or in an order other than that which is described. It should be appreciated that not all of the steps described are required to be performed, that additional steps may be added, and that some of the illustrated steps may be substituted with other steps.

FIGS. 3, 6, and 9 illustrate pseudo code for procedures according to embodiments of the present invention. It should be appreciated that some of the lines of code may result in one or more instructions being provided to the CAM device. It should also be appreciated that the pseudo code listed in FIGS. 3, 6, and 9 are exemplary lines of code and that the procedures may be represented using other instructions.

Figure 10:
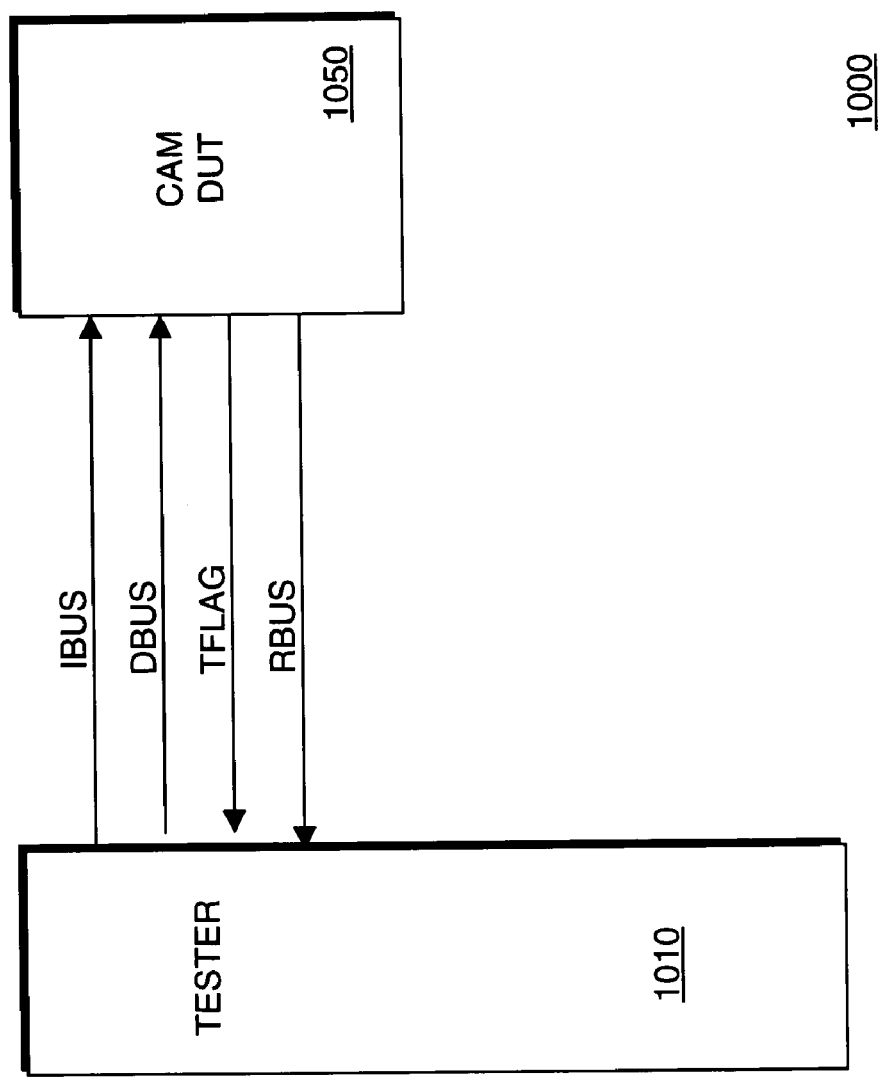
FIG. 10 is a block diagram of a test system for a CAM device according to an embodiment of the present invention.

FIG. 10 is a block diagram of a test system 1000 for a CAM device under test according to an embodiment of the present invention. The test system 1000 includes a tester 1010 and CAM DUT 1050. CAM DUT 1050 is one of CAM device 100, 400 or 700 described above. Tester 1010 is any type of ATE or other test hardware and/or software that generates the instructions for the CAM DUT as described above with respect to FIGS. 2, 3, 5, 6, 8, or 9. The tester 1010 is coupled to a DUT 1050 via a plurality of signal lines that transmit between the two entities instructions of the IBUS, data of the DBUS, compare (e.g., the index from priority encoder 160) or other results over the RBUS, and the test result flag TFLAG over another signal line.

Figure 11:
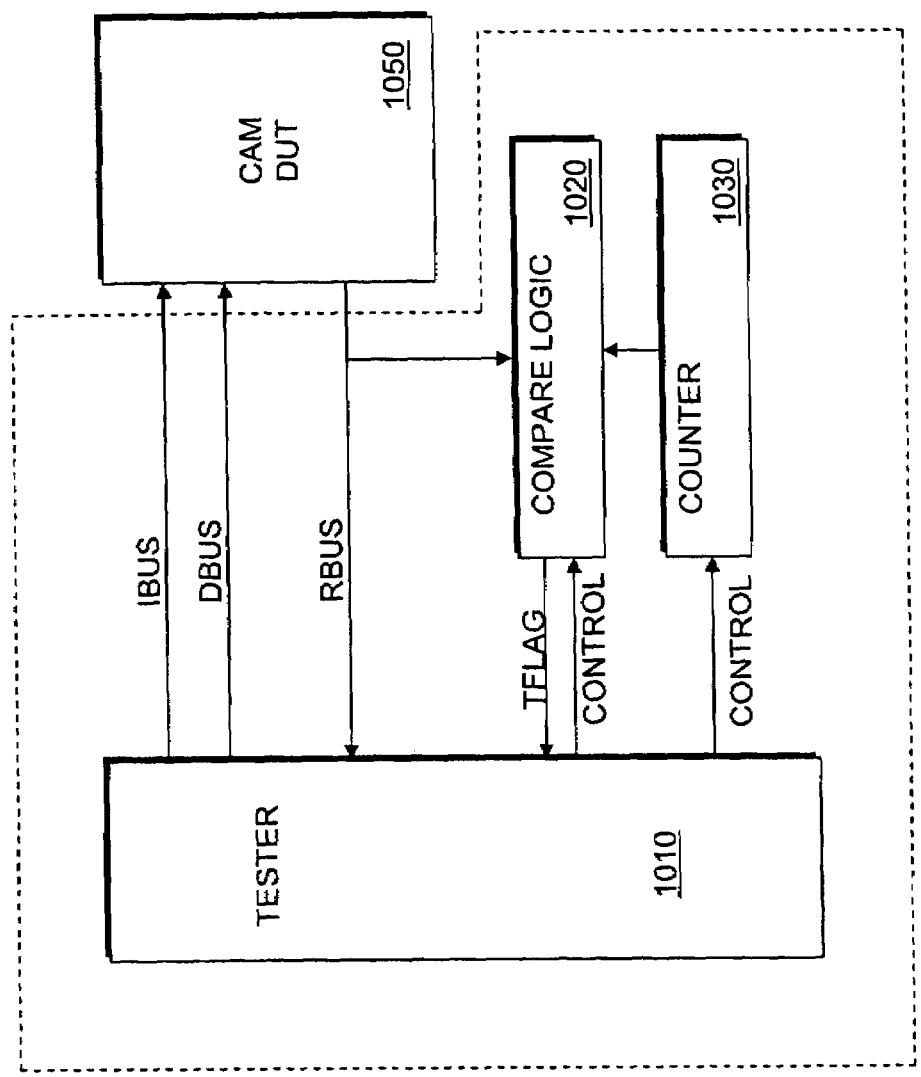
FIG. 11 is a block diagram of another test system for a CAM device according to an embodiment of the present invention.

For another embodiment, compare logic 1020 and the address counter 1030 may alternatively be physically located in or on the tester 1010 as shown in FIG. 11. Compare logic 1020 performs the same functions that compare logic 165 performs in CAM DUT 1050, and similarly, counter 1030 performs the same functions that ACTR 140 performs in CAM DUT 1050. Compare logic 1020 and/or counter 1030 may replace the functions of compare logic 165 and ACTR 140, or they may be redundant elements. For this embodiment, the index generated by the priority encoder 160 of the CAM DUT may be provided over the RBUS to be compared with the output of counter 1030 by compare logic 1020 for the various test sequences described in the figures above.

Figure 12:
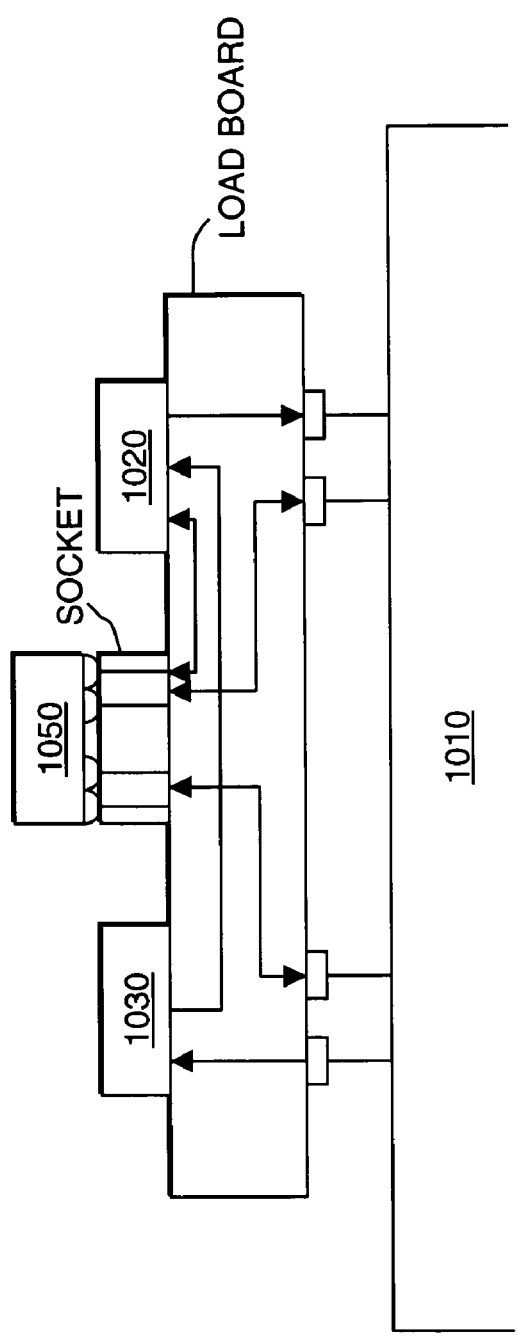
FIG. 12 is a cross-section, component-level diagram of the test system of FIG. 11.

FIG. 12 is a component, cross-sectional view diagram of the test system 1000 shown in FIG. 11 according to an embodiment of the present invention. In this embodiment, CAM DUT 1050, compare logic 1020, and counter 1030 reside on a load or test board that is in electrical contact with tester 1010 (e.g., via a test head and electrical contact points as generally known in the tester art). CAM DUT 1050 may be placed in a suitable socket for physically capturing the DUT and providing electrical contact with conductive signal paths on the load board, which are in electrical contact with compare logic 1020 and counter 1030. Various other arrangements may also be used.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device, comprising:
   a CAM array that includes a plurality of rows of CAM cells each coupled to a match line;
   a priority encoder coupled to the match lines to generate an index;
   a counter; and
   compare logic coupled to the counter and the priority encoder to compare the index and a counter value from the counter.

2. The CAM device of claim 1, wherein the counter is an address counter.

3. The CAM device of claim 1, further comprising address logic coupled to the counter and the CAM array to select at least one of the rows of CAM cells in the CAM array in response to the counter value.

4. The CAM device of claim 3, wherein the address logic comprises a decoder.

5. The CAM device of claim 3, further comprising a multiplexer coupled to the counter and the address logic to selectively output the count value or an input address for the address logic.

6. The CAM device of claim 5, wherein the multiplexer is further coupled to the priority encoder to receive the index.

7. The CAM device of claim 3, further comprising an instruction decoder coupled to the address logic and adapted to decode instructions received by the CAM device.

8. The CAM device of claim 3, further comprising a multiplexer coupled to the counter to selectively output the counter value or an input search key for the CAM array.

9. The CAM device of claim 3, further comprising a multiplexer coupled to the counter to selectively output the counter value or input data for the CAM array.

10. The CAM device of claim 1, further comprising:
    a write circuit coupled to the CAM array; and
    a comparand register coupled to the CAM array, the comparand register for storing a search key.

11. A content addressable memory (CAM) device, comprising:
a counter; and
a CAM array having a plurality of rows of CAM cells coupled to the counter to receive the counter value as a search key for the CAM array.

12. The CAM device of claim 11, further comprising:
a priority encoder coupled to receive a plurality of match signals from the plurality of rows of CAM cells and to generate an index; and
compare logic coupled to the counter and the priority encoder to compare the index and the counter value.

13. The CAM device of claim 12, further comprising address logic coupled to the counter and the CAM array to select at least one of the rows of CAM cells in the CAM array in response to the counter value.

14. The CAM device of claim 13, further comprising an instruction decoder coupled to the address logic and adapted to decode instructions received by the CAM device.

15. A content addressable memory (CAM) device, comprising:
a counter;
a CAM array having a plurality of rows of CAM cells coupled to the counter to receive the counter value to be stored in at least one of the rows of the CAM cells; and
address logic coupled to the counter and the CAM array to select at least one of the rows of CAM cells in the CAM array in response to the counter value.

16. The CAM device of claim 15, further comprising:
a priority encoder coupled to receive a plurality of match signals from the plurality of rows of CAM cells and to generate art index; and
compare logic coupled to the counter and the priority encoder to compare the index and the counter value.

17. The CAM device of claim 16, further comprising an instruction decoder coupled to the address logic and adapted to decode instructions received by the CAM device.

18. A content addressable memory (CAM) device, comprising:
a CAM array that includes a plurality of rows of CAM cells each coupled to a match line;
means for determining an index that indicates a location in the CAM array of one of the rows of CAM cells;
means for generating an address of one of the rows of CAM cells in the CAM array; and
means for determining that the address matches the index.

19. A test system, comprising:
a tester that generates test signals; and
a content addressable memory (CAM) device coupled to the tester to receive the test signals, wherein the CAM device comprises:
a CAM array that includes a plurality of rows of CAM cells each coupled to a match line;
a priority encoder coupled to the match lines to generate an index;
a counter; and
a compare logic coupled to the counter and the priority encoder to compare the index and a counter value from the counter.

20. The test system of claim 19, wherein the compare logic has an output coupled to the tester to provide an indication of the comparison between the index and the counter value.

21. The test system of claim 20, wherein the CAM device further comprises address logic coupled to the counter and the CAM array to select at least one of the rows of CAM cells in the CAM array in response to the counter value.

22. The test system of claim 21, wherein the CAM device further comprises an instruction decoder coupled to the address logic, and wherein the test signals include instructions for the CAM device, and where the instruction decoder is adapted to decode the instructions transmitted to the CAM device.

23. The test system of claim 19, wherein the tester comprises automated test equipment (ATE).

24. The test system of claim 19, wherein the tester comprises a processor.

25. A test system, comprising:
a tester that generates test signals;
a counter that generates a counter value; and
a compare logic coupled to the counter; and
a content addressable memory (CAM) device coupled to the tester to receive the test signals, wherein the CAM device comprises:
a CAM array that includes a plurality of rows of CAM cells each coupled to a match line; and
a priority encoder coupled to the match lines to generate an index, wherein the compare logic is coupled to the priority encoder to compare the index and the counter value.

26. The test system of claim 25, wherein the compare logic has an output coupled to the tester to provide an indication of the comparison between the index and the counter value.

27. The test system of claim 25, wherein the CAM device further comprises an instruction decoder coupled to the address logic, and wherein the test signals include instructions for the CAM device, and where the instruction decoder is adapted to decode the instructions transmitted to the CAM device.

28. A method for operating a content addressable memory (CAM) device, comprising:
systematically identifying locations in a CAM array of the CAM device that store data that match search keys; and
synchronizing a counter within the CAM device with the identifying such that the identifications of the locations match counter values of the counter when the CAM device is operating properly.

29. The method of claim 28, wherein the identifying comprises:
comparing the search keys with the date stored in the CAM array; and generating indices of the CAM array for the locations that store data that matches the search keys.

30. The method of claim 28, further comprising comparing the indices with the counter values.

31. A method for operating a content addressable memory (CAM) device, comprising:
comparing a search key with data stored in a plurality of rows of CAM cells;
generating an index of a location in the plurality of rows of CAM cells that indicates a match with the search key; and
comparing the index with a first counter value from a counter.

32. The method of claim 31, wherein the data is the same for each of the rows of CAM cells.

33. The method of claim 32, further comprising:
masking CAM cells in a first of the rows of CAM cells corresponding to the first counter value; and
identifying whether the index matches the first counter value.

34. The method of claim 33, further comprising:
unmasking the first row of CAM cells; and incrementing the counter to a second counter value.

35. The method of claim 34, further comprising:
masking CAM cells in a second row of the CAM cells corresponding to the second counter value;
repeating the steps of claim 31; and
identifying whether the index matches the second counter value.

36. The method of claim 32, further comprising:
identifying whether the index matches the first counter value;
invalidating the row of CAM cells that corresponds to the index; and
incrementing the counter to a second counter value.

37. The method of claim 36, further comprising:
repeating the steps of claim 31;
identifying whether the index matches the second counter value; and
invalidating the row of CAM cells that corresponds to the index.

38. The method of claim 31, further comprising writing, prior to the first comparing step, a unique value to each of the rows of CAM cells such that a first row of the CAM cells having an address corresponding to the first counter value stores the first counter value, and a second row of the CAM cells having an address corresponding to a second counter value stores a second counter value.

39. The method of claim 38, wherein the search key is the first count value.

40. The method of claim 39, further comprising incrementing the counter to the second counter value.

41. The method of claim 40, further comprising:
comparing the second counter value with the data stored in the rows of CAM cells;
generating another index of another location in the plurality of rows of CAM cells that stores the second counter value; and
comparing the another index with the second counter value.

42. A computer-readable medium having stored thereon sequence of instructions, the sequences of instructions including instructions which, when executed by a processor, causes the processor to perform the step of:
systematically identifying locations in a CAM array of the CAM device that store data that match search keys; and
synchronizing a counter within the CAM device with the identifying such that the identifications of the locations match counter values of the counter when the CAM device is operating properly.

* * * * *

UNITED STATES PATENT AND TRADEMARK OFFICE
CERTIFICATE OF CORRECTION

| | | |
|---|---|---|
| PATENT NO. | : 7,017,089 B1 | Page 1 of 1 |
| APPLICATION NO. | : 10/004209 | |
| DATED | : March 21, 2006 | |
| INVENTOR(S) | : Charles C. Huse | |

It is certified that error appears in the above-identified patent and that said Letters Patent is hereby corrected as shown below:

Col. 14, line 44, change "date" to -- data --.

Signed and Sealed this

Twenty-first Day of November, 2006

JON W. DUDAS
*Director of the United States Patent and Trademark Office*